United States Patent
Schell

(10) Patent No.: US 6,724,177 B2
(45) Date of Patent: Apr. 20, 2004

(54) METHOD AND APPARATUS FOR ACCURATE MEASUREMENT OF COMMUNICATIONS SIGNALS

(75) Inventor: Stephan V. Schell, San Francisco, CA (US)

(73) Assignee: Tropian, Inc., Cupertino, CA (US)

( * ) Notice: Subject to any disclaimer, the term of this patent is extended or adjusted under 35 U.S.C. 154(b) by 0 days.

(21) Appl. No.: 09/738,114

(22) Filed: Dec. 14, 2000

(65) Prior Publication Data

US 2002/0075013 A1 Jun. 20, 2002

(51) Int. Cl.$^7$ .................. G01R 23/14; G01R 23/00; G01R 23/16
(52) U.S. Cl. .............. 324/76.23; 324/76.19; 324/76.21
(58) Field of Search ............... 324/76.23, 615, 324/76.19, 76.21, 455, 624, 527, 140 R, 622; 342/165; 455/67

(56) References Cited

U.S. PATENT DOCUMENTS

| | | | |
|---|---|---|---|
| 2,929,989 A | | 3/1960 | Hurvitz ............ 327/57 |
| 5,789,927 A | | 8/1998 | Belcher ............ 324/622 |
| 5,832,247 A | * | 11/1998 | Gildea et al. ............ 395/309 |
| 6,018,784 A | * | 1/2000 | Gildea et al. ............ 710/311 |
| 6,078,290 A | * | 6/2000 | McBurney et al. ...... 342/417 |
| 6,134,223 A | * | 10/2000 | Burke et al. ............ 370/265 |
| 6,161,004 A | * | 12/2000 | Galal et al. ............ 455/302 |
| 6,208,844 B1 | * | 3/2001 | Abdelgany ............ 455/82 |
| 6,211,663 B1 | * | 4/2001 | Moulthrop et al. ...... 324/76.23 |
| 6,243,430 B1 | * | 6/2001 | Mathe ............ 375/346 |
| 6,298,103 B1 | * | 10/2001 | Huang et al. ............ 375/355 |

FOREIGN PATENT DOCUMENTS

EP 0499346 3/1988

OTHER PUBLICATIONS

Ken Kundert, "Introduction to RF Simulation and Its Application" 0-7803-4497-Sep./1998/$10.00 © 1998 IEEE

* cited by examiner

*Primary Examiner*—Charles H. Nolan, Jr.
*Assistant Examiner*—Waseem H. Hamdan
(74) *Attorney, Agent, or Firm*—Thelen Reid & Priest, LLP

(57) ABSTRACT

The present invention, generally speaking, provides a method and apparatus for accurately measuring a communications signal. In accordance with one aspect of the invention, DC offset effects and nonlinearities attributable to a communications amplifier are made spectrally separable from DC offset effects and nonlinearities attributable to the measurement apparatus. Spectral separability may be accomplished, for example, by adding an offset frequency to a local oscillator used by a downconverter of the measurement apparatus. As a result, the signal of interest is moved away from baseband (zero frequency) to the offset frequency. Similarly, other nonlinearities in the video amplifier (such as third order distortion) manifest theselves mostly at harmonics of the offset frequency. Hence spectral separability between the power amplifier characteristics and these nonlinear impairments of the measurement system is achieved. At the offset frequency, the signal of interest may be represented by a single signal component (e.g., the in-phase component I) instead of requiring an I/Q representation. The measurement apparatus may therefore be dramatically simplified, and errors stemming from undesired interaction of I and Q signal processing chains may be avoided. In accordance with another aspect of the invention, the effects of noise are mitigated through different averaging methods.

4 Claims, 5 Drawing Sheets

METHOD AND APPARATUS FOR ACCURATE MEASUREMENT OF COMMUNICATIONS SIGNALS

BACKGROUND OF THE INVENTION

1. Field of the Invention

The present invention relates to the measurement of communications signals.

2. State of the Art

Predistortion is commonly used in communications signal transmitters to compensate for signal distortion introduced by transmitter components. In wireless communications, for example, the final stage of a power amplifier is often the source of significant distortion, in particular AM/AM distortion and AM/PM distortion. Device characterization attempts to identify the distortion characteristics of a device to enable predistortion to be performed, the predistortion and the distortion ideally cancelling each other, leaving a distortion-free signal.

Device characterization requires signal measurement. Measurement circuitry, however, may also introduce significant distortion. In the case of a wireless communications system, for example, a typical characterization setup for characterizing a power amplifier is as shown in FIG. 1. A suitably-chosen RF stimulus (or "probe signal") 101 is applied to a power amplifier 103, which produces a communications signal 105. The communications signal is applied to an I/Q demodulator and data converter 107, which produces digital I and Q signals 109. An I/Q compensator 111 alters the digital I and Q signals to compensate to the extent possible for non-idealities of the I/Q demodulator. Compensated digital I and Q 113 are input to a data analysis unit 115 (e.g., a stored-program computer), which produces estimates of an AM/AM distortion curve of the power amplifier and a AM/PM distortion curve of the power amplifier.

The amplifier of FIG. 1 may be a conventional linear amplifier, as shown in FIG. 2, or may be a non-linear amplifier of a type shown in FIG. 3.

A more detailed diagram of a main portion of the conventional measurement setup of FIG. 1 is shown in FIG. 4. An output signal 405 of a power amplifier 403 is applied to an RF port of a mixer 407. Applied to a local oscillator port of the mixer is a local oscillator signal 409 having a frequency equal to the sum of a carrier frequency $f_c$ of the RF signal and a desired intermediate frequency $f_{IF}$. The carrier frequency may be in the range of many hundreds of megahertz, for example, while the intermediate frequency may be in the range of many tens of megahertz. The mixer 407 produces an output signal 411 at the intermediate frequency. The intermediate frequency signal is split into two signals, one of which is applied to an I (in-phase processing) chain $420_I$ and one of which is applied to a Q (quadrature processing) chain $420_Q$. The I and Q chains are largely identical, each having a mixer 421, followed by a low-pass filter 423, a video amplifier 425, a further low-pass filter 427, and an A/D converter 429. A local oscillator (not shown) produces a reference signal 431 that is applied directly to the mixer of the I chain. A 90 degree phase shifter 433 produces a quadrature version of the reference signal, which is applied to the mixer of the Q chain. Digital outputs of the I and Q chains are combined to form a single complex number stream z(t), the combination being effected by a j operator 435 and a summation block 437.

The foregoing setup is acceptable where accuracies of 10%, or perhaps even some few percent, are acceptable. In high-data-rate wireless communications systems, however, accuracies of less than 1% may be required. The conventional setup of FIG. 1 does not allow for such accuracy to be obtained.

More particularly, the I/Q video amplifiers 423 are a source of various types of errors, including I/Q gain mismatch, different DC offsets, and non-linearity. The standard approach to signal measurement is particularly susceptible to the latter two sources of error. Furthermore, the power amplifier 403 itself exhibits what may also be termed DC offset, as a result of AM/AM distortion.

Assume that the RF stimulus 401 exhibits a sawtooth envelope. Whereas ideally the output signals of the I/Q video amplifiers would have a sawtooth envelope varying between a minimum amplitude $a_0$ and a maximum amplitude $a_1$, as illustrated in FIG. 5, instead, these amplitude levels are shifted by a combination of DC offsets from the power amplifier (the offset of interest, caused by AM/AM distortion of the power amplifier, denoted herein by $DC_{PA(AM/AM)}$) and from the I/Q video amplifiers ("nuisance" offsets, denoted herein by $DC_{VA}$). Identifying the different offset components is analogous to being asked to guess two numbers given their sum—the offsets are, in practical terms, inseparable.

An additional source of significant error is the phase shifter 433, which typically will have a tolerance of a few degrees of phase. If an accuracy of a fraction of a degree is desired, clearly such an error is intolerable.

SUMMARY OF THE INVENTION

The present invention, generally speaking, provides a method and apparatus for accurately measuring a communications signal. In accordance with one aspect of the invention, DC offset effects and nonlinearities attributable to a communications amplifier are made spectrally separable from DC offset effects and nonlinearities attributable to the measurement apparatus. Spectral separability may be accomplished, for example, by adding an offset frequency to a local oscillator used by a downconverter of the measurement apparatus. As a result, the signal of interest is moved away from baseband (zero frequency) to the offset frequency. Similarly, other nonlinearities in the video amplifier (such as third order distortion) manifest theselves mostly at harmonics of the offset frequency. Hence spectral separability between the power amplifier characteristics and these nonlinear impairments of the measurement system is achieved. At the offset frequency, the signal of interest may be represented by a single signal component (e.g., the in-phase component I) instead of requiring an I/Q representation. The measurement apparatus may therefore be dramatically simplified, and errors stemming from undesired interaction of I and Q signal processing chains may be avoided. In accordance with another aspect of the invention, the effects of noise are mitigated through different averaging methods.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 1:
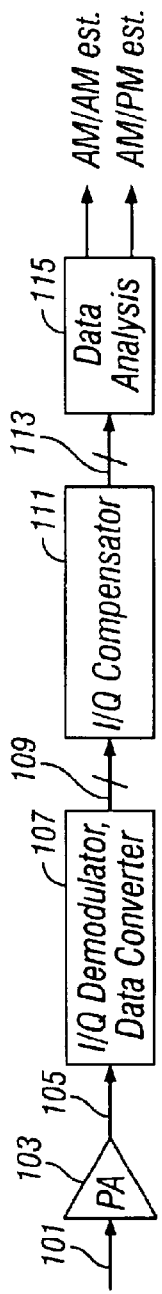
FIG. 1 is a simplified diagram of a known signal measurement apparatus.
Figure 2:
FIG. 2 is a diagram of a one power amplifier with which the signal measurement apparatus of FIG. 1 may be used.
Figure 3:
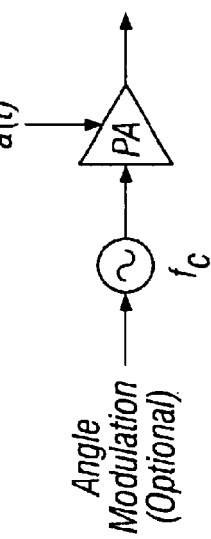
FIG. 3 is a diagram of another power amplifier with which the signal measurement apparatus of FIG. 1 may be used.
Figure 4:
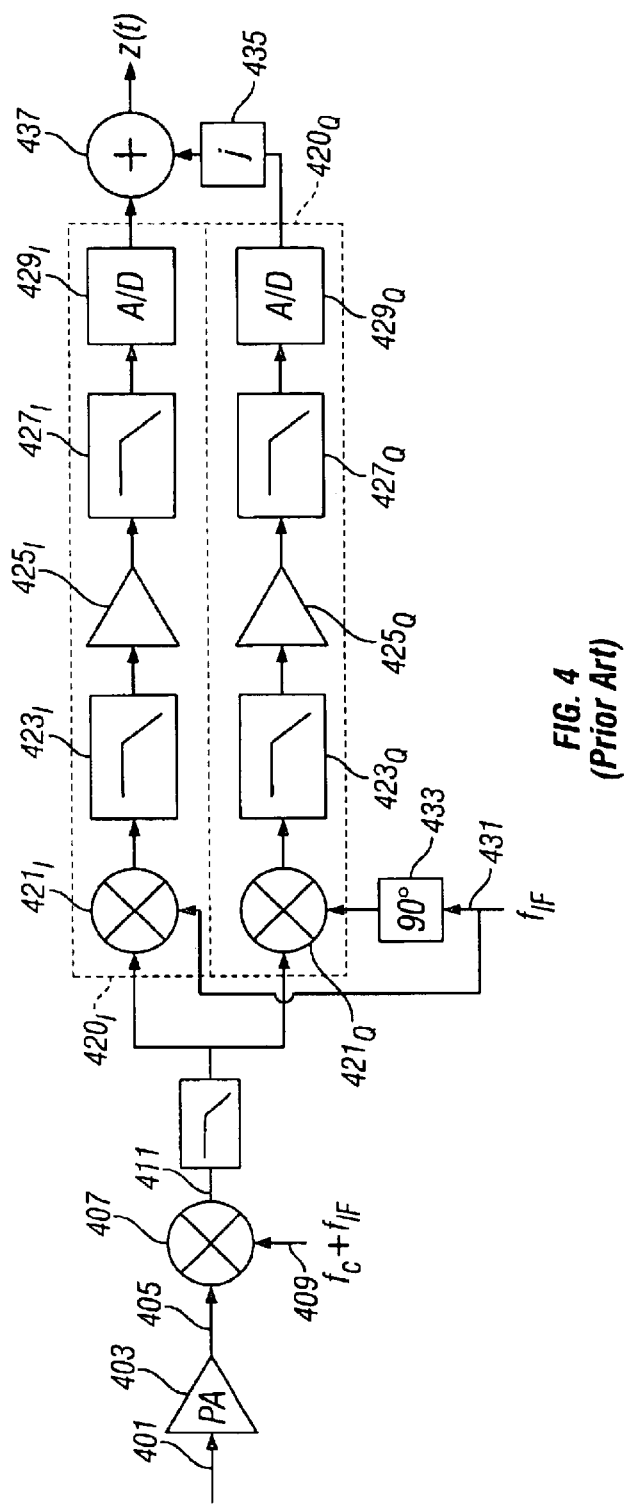
FIG. 4 is a more detailed diagram of the signal measurement of FIG. 1.
Figure 5:
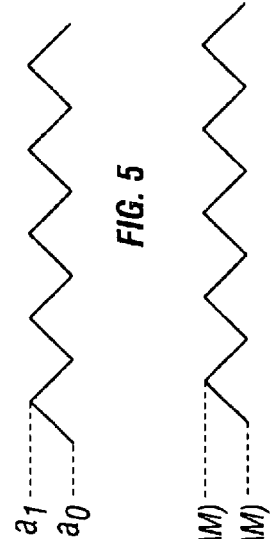
FIG. 5 is a diagram of an example of a signal envelope that may be used to generate modulation of the output signal of the power amplifier of FIG. 1.
Figure 6:
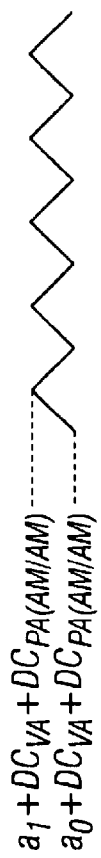
FIG. 6 is a diagram of the signal envelope of the in-phase signal I(t) at a particular point in the signal measurement apparatus of FIG. 1.
Figure 7:
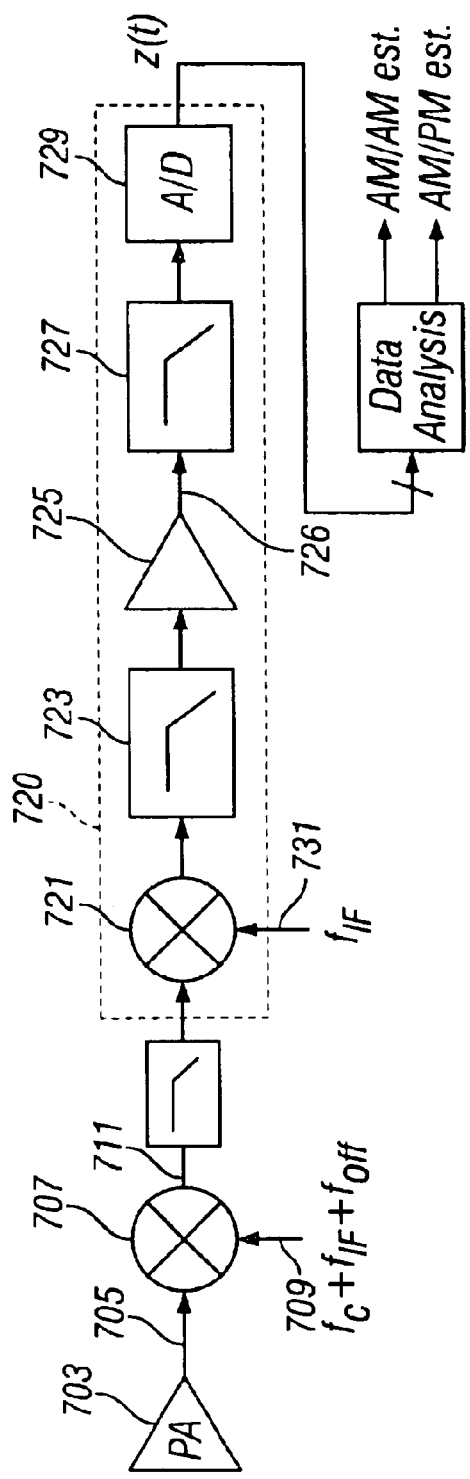
FIG. 7 is a diagram of an embodiment of a signal measurement apparatus allowing for increased accuracy of measurement.

Referring now to FIG. 7, a diagram is shown of a signal measurement apparatus that may be used to achieve accurate measurement of a communications signal, like numerals designating like elements as in figures previously described. A salient feature of the apparatus of FIG. 7 is a chosen reference frequency 709 applied to a downconverter 707. Recall that in the conventional signal measurement apparatus (FIG. 4), the reference frequency 409 is the sum of the carrier frequency and a chosen intermediate frequency, the intermediate frequency being used as the reference frequency of a subsequent I/Q demodulator. For purposes of comparison, one may imagine the reference frequency applied to the downconverter as including a further offset frequency, $f_{off}$, that in the case of FIG. 4 is equal to zero.

In the apparatus of FIG. 7, by contrast, $f_{off}$ is non-zero. In an exemplary embodiment, $f_{off}$ is in the range of several hundred kilohertz. Furthermore, in the same exemplary embodiment, the I/Q demodulator of the prior art is omitted. That is, an intermediate-frequency representation of the signal of interest may be used directly for analysis purposes instead of a baseband representation. In this arrangement, then, only a single signal processing chain 720 is required instead of separate I and Q chains as in the prior art. Substantial cost savings results. Furthermore, undesirable cross-talk between the I and Q signal chains of the prior art is eliminated.

Those of ordinary skill in the art will recognize that the two-stage down-conversion of FIG. 7 may optionally be replaced with direct down-conversion using a single mixer.

Figure 8:
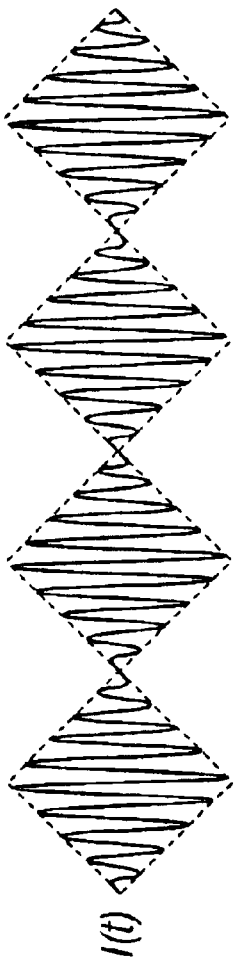
FIG. 8 is a diagram of the in-phase signal I(t) at a particular point in the signal measurement apparatus of FIG. 1.

The use of an intermediate-frequency representation for analysis purposes achieves spectral separability of a signal characteristic of interest—in this case, the offset of the power amplifier, $DC_{PA(AM/AM)}$—and the measurement artifact $DC_{VA}$. The intermediate frequency signal at $f_{off}$ produced by the downconverter and processed by the processing chain may be represented as shown in FIG. 8, where sawtooth amplitude modulation has been assumed.

The signal 705 in the apparatus of FIG. 7 may be represented as follows:

$$g(a(t))\cos(\omega_c t)$$

Note that the offset $DC_{PA(AM/AM)}$ of the power amplifier, representing one aspect of the function $g(a(t))$, modifies the amplitude of the carrier signal.

The signal 711 in the apparatus of FIG. 7 may be represented as follows:

$$g(a(t))\cos(\omega_{off} t)$$

where the signal has been downconverted from the carrier frequency to the offset frequency.

The signal 726 in the apparatus of FIG. 7 may be represented as follows:

$$g(a(t))\cos(\omega_{off} t)G_I + DC_{VA}$$

where $G_I$ is the gain of the video amplifier and $DC_{VA}$ is the offset of the video amplifier. Note that the offset $DC_{VA}$ is in fact a zero-frequency component. The offset of the power amplifier, $DC_{PA(AM/AM)}$, while it is referred to zero frequency in the conventional arrangement, remains at the offset frequency in the present arrangement. Hence, spectral separability of the two components is achieved.

Similarly, other nonlinearities in the video amplifier (such as third order distortion) manifest theselves in signal 726 mostly at harmonics of the offset frequency $f_{off}$. Hence spectral separability between the power amplifier characteristics and these nonlinear impairments of the measurement system is achieved.

Figure 9:
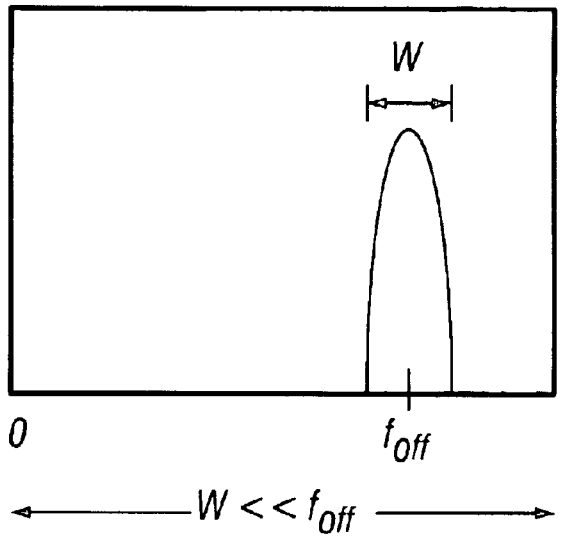
FIG. 9 is a frequency plot illustrating the spectral separation achieved using the signal measurement apparatus of FIG. 7.

The foregoing spectral separability is illustrated in FIG. 9. The signal of FIG. 8 will occupy a frequency band of width W centered about the offset frequency $f_{off}$. Spectral separability is achieved by choosing W<<$f_{off}$. When this condition is satisfied, sufficient separation is assured to achieve high accuracy measurements. Preferably, $f_{off}$ is at least five times W, more preferably 10 times W, and most preferably more than 10 times. In an exemplary embodiment, W is about 5 kHz and $f_{off}$ is about 500 kHz. Hence, unlike a known IF-sampling approach that uses wider bandwidth signals and faster A/D converters, the present invention uses narrower bandwidth probe signals and slower, higher-quality A/D converters. Separation of desired signal components from undesired signal components may be achieved using a simple bandpass filter or the equivalent amount of filtering of the discrete-time signal z(t).

In the embodiment of FIG. 7, because no phase shifter is required, the phase shifter is eliminated as a source of error.

Figure 10:
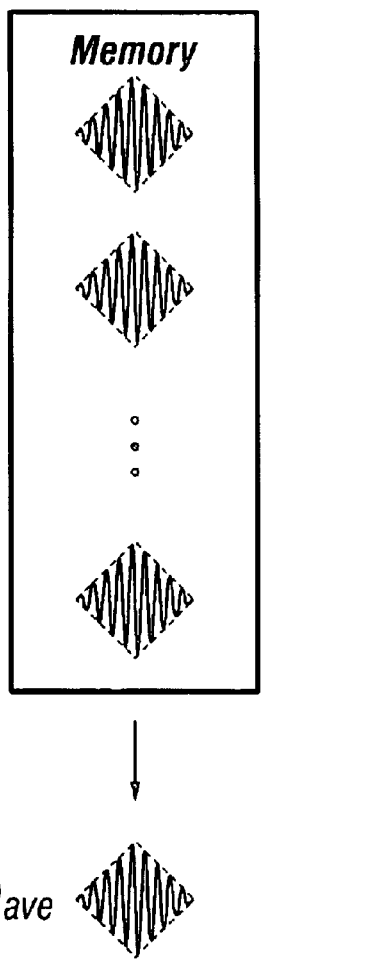
FIG. 10 is a diagram illustrating conceptually one averaging operation useful in reducing the effects of noise, which may be used in conjunction with the signal measurement apparatus of FIG. 7.

The other dominant source of error in the system is noise. Substantial noise reduction may be achieved using averaging. For example, averaging may be performed between different periods of the amplitude modulation signal. Such an arrangement is illustrated conceptually in FIG. 10. Multiple datasets are stored, each corresponding to the output signal accumulated over one full period of the amplitude modulation signal. By averaging multiple such datasets, a dataset may be obtained in which the effects of noise are substantially reduced.

Figure 11:
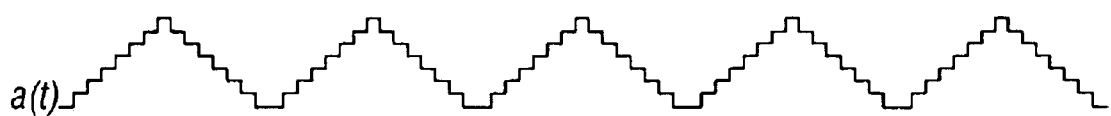
FIG. 11 is a diagram of another example of a signal envelope that may be used to generate modulation of the output signal of the power amplifier of FIG. 1.
Figure 12:
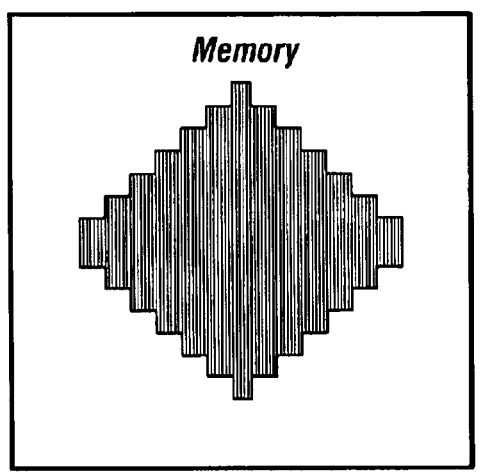
FIG. 12 is a diagram illustrating conceptually another averaging operation useful in reducing the effects of noise, which may be used in conjunction with the signal measurement apparatus of FIG. 7.
Figure 12:
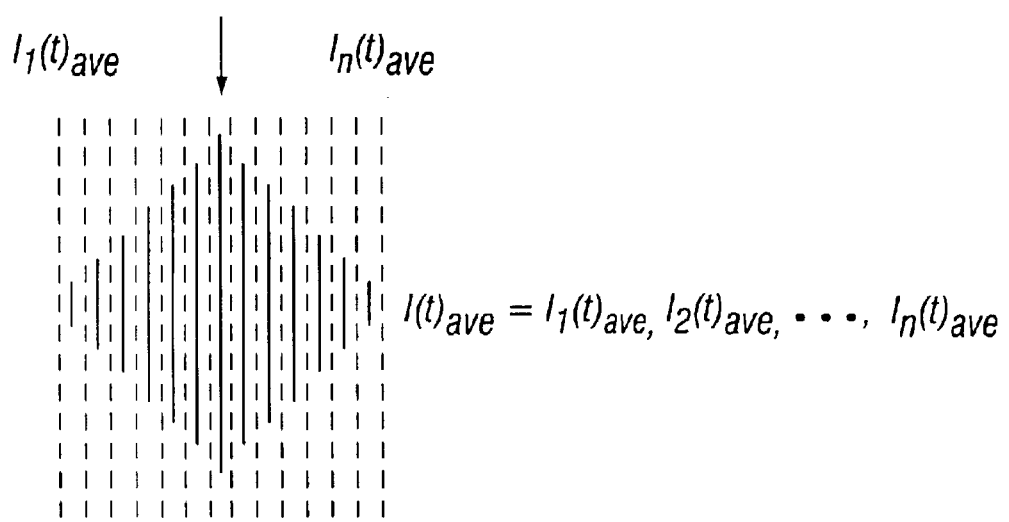

Various other averaging techniques may also be used. For example, the amplitude modulation signal, instead of being a continuously-varying signal, may take the form of a stair-step signal as shown in FIG. 11. Multiple measurement values accumulated over corresponding stair steps may be combined to obtain a reduced-noise dataset. This manner of operation is conceptually illustrated in FIG. 12.

In some instances (as when using an existing apparatus, for example), it may be advantageous to use a measurement apparatus like that of FIG. 4, including an I/Q demodulator and both I and Q processing chains. The same benefits of spectral separability may be obtained by the simple expedient of adding a frequency offset $f_{off}$ to the reference frequency of the downconverter.

Thus there has been described a communications signal measurement method and apparatus that enables improved measurement accuracy to be achieved. Distortions of the measurement apparatus are separated from distortions of a communications signal amplifier, allowing the latter to be accurately characterized. Accurate characterization allows in turn for accurate predistortion, whereby the performance of the communications signal amplifier may be substantially improved.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of obtaining a measurement signal from a communications signal, the method comprising:

applying a comparatively low-rate periodic modulation pattern to a carrier signal to form an input signal;

using a communications signal amplifier to amplify the input signal, thereby producing a communications signal exhibiting distortion due to impairments of the communication signal amplifier;

down-converting the communications signal to produce a comparatively low-rate intermediate-frequency signal; and conditioning the intermediate-frequency signal to produce a measurement signal representing the communications signal, including amplifying the intermediate-frequency signal using a video amplifier, the measurement signal exhibiting distortion due to impairments of the video amplifier;

wherein the measurement signal occupies a frequency bandwidth centered about a center frequency that is many times the frequency bandwidth, and distortion due to impairments of the communication signal amplifier is spectrally separated from distortion due to impairments of the video amplifier.

2. The method of claim 1, further comprising:

accumulating values of the measurement signal to form multiple datasets over the course of respective periods of the periodic modulation pattern; and averaging multiple datasets to form a reduced-noise dataset.

3. The method of claim 1, wherein the periodic modulation pattern is a stair-step pattern, further comprising:

averaging multiple values of the measurement signal during a portion of the measurement signal corresponding to a horizontal portion of the stair-step pattern to form at least one reduced-noise value.

4. Apparatus for obtaining a measurement signal from a communications signal produced by a communications signal amplifier and having a comparatively low-rate periodic modulation pattern applied to a carrier signal, the apparatus comprising:

a downconverter coupled to the communications signal for producing a comparatively low-rate intermediate-frequency signal;

means for conditioning the intermediate-frequency signal to produce a measurement signal representing the communications signal, wherein the measurement signal occupies a frequency bandwidth centered about a center frequency that is many times the frequency bandwidth; and a data analysis unit responsive to the measurement signal for producing an estimated distortion curve describing an estimated distortion characteristic of the communications signal.

* * * * *